United States Patent
Hsieh

(10) Patent No.: US 8,274,113 B1
(45) Date of Patent: Sep. 25, 2012

(54) TRENCH MOSFET HAVING SHIELDED ELECTRODE INTEGRATED WITH TRENCH SCHOTTKY RECTIFIER

(75) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 35 days.

(21) Appl. No.: 13/106,082

(22) Filed: May 12, 2011

(51) Int. Cl.
*H01L 29/78* (2006.01)
(52) U.S. Cl. ............ 257/334; 257/301; 257/E29.262; 257/E27.091; 257/330; 257/288
(58) Field of Classification Search ........... 257/288–350, 257/401, 901
See application file for complete search history.

(56) References Cited

U.S. PATENT DOCUMENTS

| 2006/0273386 A1* | 12/2006 | Yilmaz et al. ........... 257/330 |
| 2010/0176448 A1* | 7/2010 | Hsieh ............... 257/334 |
| 2010/0219461 A1* | 9/2010 | Rinehimer ........... 257/328 |
| 2010/0279478 A1* | 11/2010 | Hsieh ............... 438/270 |

\* cited by examiner

*Primary Examiner* — N Drew Richards
*Assistant Examiner* — Mamadou Diallo
(74) *Attorney, Agent, or Firm* — Bacon & Thomas, PLLC

(57) ABSTRACT

A trench MOSFET having shielded gate in parallel with trench Schottky rectifier is formed on a single chip to further increase the efficiency of the trench MOSFET having shielded electrode. As the size of present device is getting smaller and smaller, the trench Schottky rectifier of this invention is able to be shrink and, at the same time, to achieve lower forward voltage drop and lower reverse leakage current.

20 Claims, 7 Drawing Sheets

TRENCH MOSFET HAVING SHIELDED ELECTRODE INTEGRATED WITH TRENCH SCHOTTKY RECTIFIER

CROSS-REFERENCES TO RELATED APPLICATIONS

This application claims priority from application Ser. No. 12/659,639 filed Mar. 16, 2010 which is continuation in part of application Ser. No. 12/213,628 now U.S. Pat. No. 7,816,732.

FIELD OF THE INVENTION

This invention relates generally to the cell structure, device configuration of semiconductor devices. More particularly, this invention relates to an improved trench MOSFET (Metal Oxide Semiconductor Field Effect Transistor) having shielded electrode integrated with trench Schottky rectifier on a single chip to improve operation efficiency.

BACKGROUND OF THE INVENTION

Trench MOSFET having gate electrode over shielded electrode structure provides advantages over conventional trench MOSFET, such as reduced gate to drain charge Qgd, and reduced on-resistance. See for example, U.S. Pat. Nos. 5,998,833 and 7,768,064. The superior performance of the trench MOSFET having shielded electrode is an excellent choice for DC/DC converter. Meanwhile, in order to further increase the efficiency of the trench MOSFET having shielded electrode, the parasitic PN body diode of the trench MOSFET must be prevented from turning on, because once the parasitic PN body diode is turned on, both electron and hole carriers are generated that requires longer time to eliminate these carriers through the electron-hole combinations, thus reducing the efficiency of the trench MOSFET. Therefore, a Schottky rectifier is chosen to be implemented as a clamping diode in parallel to the parasitic PN body diode to prevent the body diode from turning on because that, the Schottky rectifier is operated with a single carrier, e.g., the carriers consisted of electrons only, and this single type of carriers can be drawn from the drain electrode. Therefore, the Schottky rectifier is an effective and preferred clamping diode to increase the operational efficiency of the semiconductor power device. The Schottky clamping operation can be realized when the forward voltage Vf of the Schottky rectifier is less than the parasitic diode that is approximately 0.7 volts.

Accordingly, it would be desirable to provide a new and improved device configuration to further improving the characteristic of the trench MOSFET having shielded electrode by integrating a trench Schottky rectifier on a single chip.

SUMMARY OF THE INVENTION

It is therefore an object of the present invention to provide a new and improved semiconductor power device such as an integrated circuit comprising a trench MOSFET having shielded electrode and a trench Schottky rectifier on a single chip for better operation performance. According to the present invention, there is provided an integrated circuit comprising a plurality of trench MOSFETs and a plurality of trench Schottky rectifiers horizontally disposed in two different areas further comprising: a substrate of a first conductivity type; an epitaxial layer of the first conductivity type over the substrate, the epitaxial layer having a lower doping concentration than the substrate; a plurality of gate trenches extending into the epitaxial layer; a trench MOSFET comprising a gate electrode over a shielded electrode in each the gate trench wherein the gate electrode and the shielded electrode insulated from each other by an inter-electrode insulation layer, and the gate electrode is insulated from a source region of the first conductivity type and body region of a second conductivity type by a first gate insulation layer and the shield electrode is insulated from the epitaxial layer by a second gate insulation layer; the first gate insulation layer along the gate trenches is less than the second insulation layer; the gate electrode surrounded by the source region encompassed in the body region above the shielded electrode; the gate electrode connected to a gate metal and the shielded electrode to a source metal; a contact insulation layer covering the integrated circuit with a source-body contact trench opened in the trench MOSFET through the source and extended into the body regions and filled with a contact metal plug overlying a barrier metal layer therein, the contact metal plug filled in the source-body contact trench connected with the source metal; a trench Schottky rectifier formed into the epitaxial layer in a different area from the trench MOSFET and having a Schottky barrier layer lined in a Schottky contact trench filled with the contact metal plug overlying the barrier metal layer directly contacting the Schottky contact trench bottom and sidewalls, and between a pair of adjacent gate trenches wherein the source and body regions do not exist, the contact metal plug filled in the Schottky contact trench connected with an anode metal; the gate trenches in the trench MOSFET and trench Schottky rectifier having a greater trench depth than the Schottky contact trench into the epitaxial layer; the Schottky rectifier formed at least along sidewalls of the Schottky contact trench in the epitaxial layer, separated from the pair of adjacent gate trenches by the epitaxial layer without having the source and body regions surrounding the Schottky contact trench sidewalls; at least a gate contact trench in the trench MOSFET opened through the contact insulation layer and extended into the gate electrode in a wide gate trench having a greater trench width than the gate trenches in the trench MOSFET, and filled with the contact metal plug overlying a barrier metal layer therein, the contact metal plug filled in the gate contact trench connected with the gate metal; and the source metal and the anode metal connected together as a source/anode metal.

In other preferred embodiments, this invention include one or more of following features: the gate trench in the trench Schottky rectifier is filled with the gate electrode over the shielded electrode wherein the gate electrode and the shielded electrode insulated from each other by an inter-electrode insulation layer, and the gate electrode is insulated from the epitaxial layer by the first gate insulation layer and the shielded electrode is insulated from the epitaxial layer by a second gate insulation layer; the first gate insulation layer along the gate trenches is thinner than the second insulation layer; the gate electrode in the trench Schottky rectifier extends to a wide gate electrode in a wide gate trench having a greater trench width than the gate trenches in the trench Schottky rectifier, and at least a gate contact trench in the trench Schottky rectifier opened through the contact insulation layer and extended into the wide gate electrode in the trench Schottky rectifier, and filled with the contact metal plug overlying a barrier metal layer therein, the contact metal plug filled in the wide gate electrode in the trench Schottky rectifier connected with the source/anode metal and separated from the gate electrode in the trench MOSFET; the gate trench in the trench Schottky rectifier is only filled with the shielded electrode wherein the shielded electrode insulated from the epitaxial layer by the second gate insulation layer;

the shielded electrode in the trench Schottky rectifier extends to a wide shielded electrode in a wide gate trench having a greater trench width than the gate trenches in the trench Schottky rectifier, and at least a shielded contact trench in the trench Schottky rectifier opened through the contact insulation layer and extended into the wide shielded electrode in the Schottky rectifier, and filled with the contact metal plug overlying a barrier metal layer therein, the contact metal plug filled in the wide shielded contact trench connected with the source/anode metal; the barrier metal layer lines in the source-body contact and the Schottky contact trenches is Ti/TiN or Co/TiN; the contact metal plug overlying the barrier metal layer is tungsten; the Schottky barrier layer comprises $TiSi_2$(Ti Silicide) or $CoSi_2$(Co Silicide); the source/anode metal and the gate metal are Ti/Aluminum alloys, Ti/TiN/Aluminum alloys, or Ti/TIN/Copper disposed on top surface of the contact insulation layer and the contact metal plugs; the Schottky barrier layer lines along sidewalls and bottom of the Schottky contact trench; the Schottky barrier layer lines along only sidewalls of the Schottky contact trench in the epitaxial layer; the epitaxial layer is a single epitaxial layer; the epitaxial layer is a double epitaxial layer with a doping concentration of the top epitaxial layer less than that of the bottom epitaxial layer; the integrated circuit further comprises a body contact region of the second conductivity type formed only within the body region wrapping sidewalk and bottom of each the source-body contact trench, but not formed within the trench Schottky rectifier, wherein the body contact region has a higher doping concentration than the body region; the integrated circuit further comprises a Schottky barrier height enhancement region of the first conductivity type having doping concentration less than the epitaxial layer, formed within the epitaxial layer in the Schottky rectifier and wrapping sidewalls and bottom of each the Schottky contact trench; the integrated circuit further comprises a Schottky barrier layer enhancement region of the second conductivity type within the epitaxial layer in the Schottky rectifier and wrapping sidewalls and bottom of each the Schottky contact trench; the contact metal plug filled in the source-body contact trench and the gate contact trench in the trench MOSFET, and the Schottky contact trench in the trench Schottky rectifier extends to cover top surface of the contact insulation layer connected with the gate metal and the source/anode metal, respectively; the contact metal plug is tungsten layer deposited over a Ti/TiN or Co/TiN barrier metal layer, covering the contact insulation layer; the source/anode metal and the gate metal are Ti/Aluminum alloys, Ti/TIN/Aluminum alloys, or Ti/TiN/Copper disposed on top of the contact metal plug; the first gate insulation layer has a thickness along the gate trenches less than that of the second gate insulation layer.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1:
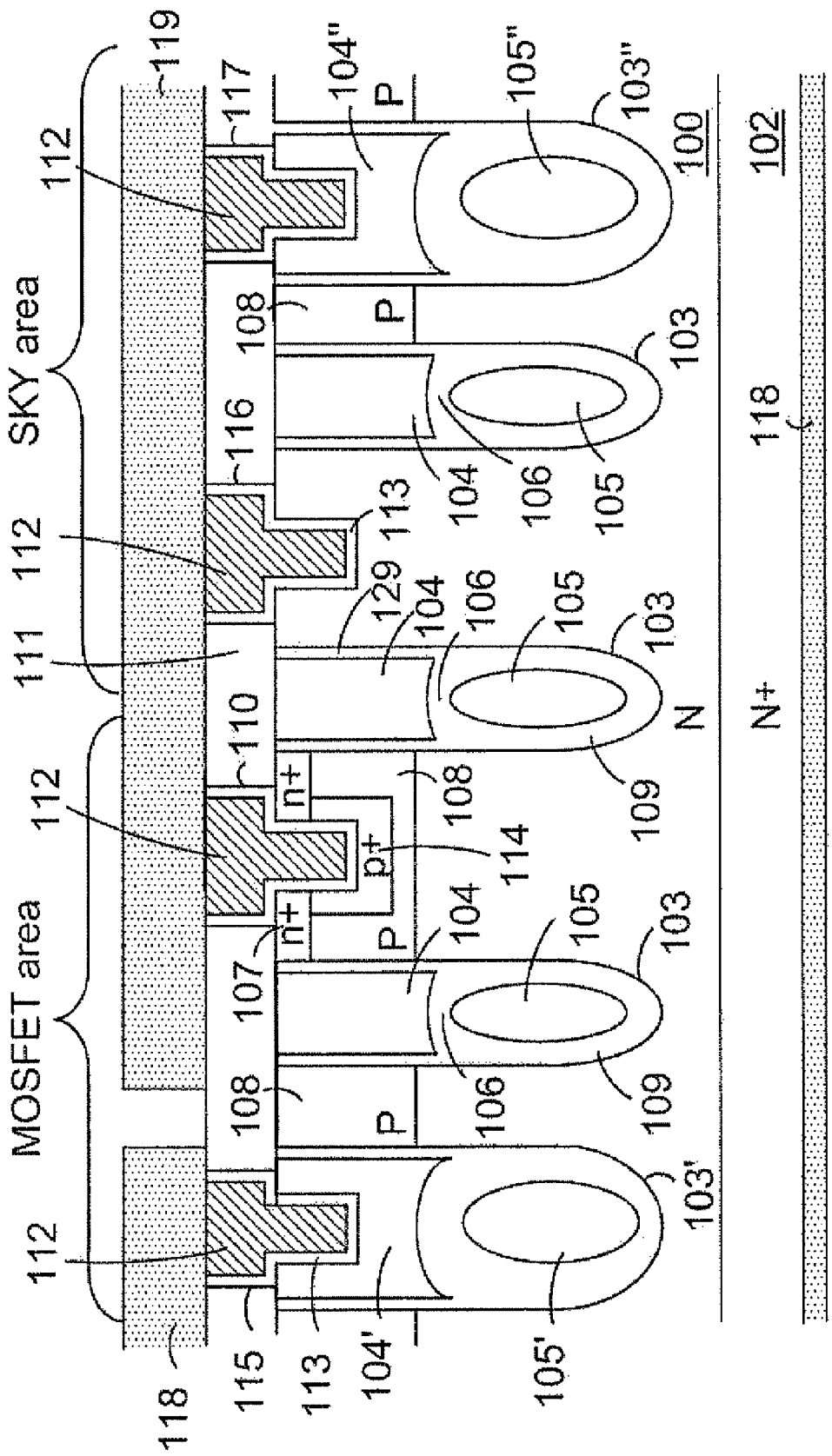
FIG. 1 is a cross-sectional view of a preferred embodiment according to the present invention.

Please refer to FIG. 1 for a preferred N-channel integrated circuit comprising a trench MOSFET and a trench Schottky rectifier (SKY, as illustrated in FIG. 1) on a single chip. The N-channel circuit is formed in an N epitaxial layer 100 supported on a heavily doped N+ substrate 102 which coated with back metal 118 on the rear side as drain/cathode metal. A plurality of gate trenches 103 are formed extending in the N epitaxial layer 100, each of the gate trenches 103 is filled with a gate electrode 104 over a shielded electrode 105, wherein the gate electrode 104 and the shielded electrode 105 is insulated from each other by an inter-electrode insulation layer 106, the gate electrode 104 is insulated from an N+ source region 107 and a P body region 108 by a first gate oxide layer 129 and the shielded electrode 105 is insulated from the epitaxial layer 100 by a second gate insulation layer 109, wherein the gate electrode 104 is surrounded by the N+ source region 107 encompassed in the P body region 108 above the shielded electrode 105. The thickness along the gate trenches 103 of first gate insulation layer 129 is less than that of the second gate insulation layer 109. The trench MOSFET further comprises a source-body contact trench 110 opened through an contact insulation layer 111 covering the integrated circuit, and further penetrating through the N+ source region 107 and extending into the P body regions 108. The source-body contact trench 110 is filled with a contact metal plug 112, for example tungsten plug, overlying a barrier metal layer 113 therein. In the P body region 108 between a pair of the gate trenches 103 in the trench MOSFET, a p+ body contact region 114 is formed wrapping sidewalls and bottom of the source-body contact trench 110 with higher doping concentration than the P body region 108 to further reduce the contact resistance between the P body region 108 and the contact metal plug 112. The gate trenches 103 in the trench MOSFET further extends to a wide gate trench 103' with greater trench width than the gate trenches 103 and filled with a gate electrode 104' above a shielded electrode 105'. A gate contact trench 115 is opened through the contact insulation layer 111 and extended into each the gate electrode 104' in each the wide gate trench 103', and filled with the contact metal plug 112, for example tungsten plug, overlying the barrier metal layer 113 therein. The trench Schottky rectifier is formed in a different area from the trench MOSFET and having a Schottky barrier layer lined in a Schottky contact trench 116 which is penetrating through the contact insulation layer 111 and extending into the N epitaxial layer 100. The Schottky contact trench 116 is filled with the contact metal plug 112, for example tungsten plug, over the barrier metal layer 113 directly contacting sidewalls and bottom of the Schottky contact trench between a pair of adjacent gate trenches 103 wherein the source and body region do not exist, wherein the gate trenches 103 in the trench MOSFET and trench Schottky rectifier have a greater trench depth than the Schottky contact trench 116 into the N epitaxial layer 100.

The gate trenches 103 in the trench Schottky rectifier further extend to a wide gate trench 103" having a greater trench width than the gate trenches 103, and filled with a gate electrode 104" above a shielded electrode 105". A gate contact trench 117 is opened through the contact insulation layer 111 and extended into each the gate electrode 104" in each the wide gate trench 103", and filled with the contact metal plug 112, for example tungsten plug, overlying the barrier metal layer 113 therein. Onto the contact insulation layer 111, a front metal layer is formed and patterned to act as a gate metal 118 and a source/anode metal 119, wherein the gate metal 118 is contacting with the contact metal plug 112 in the gate contact trench 115, and the source/anode metal 119 is contacting with the contact metal plugs 112 in the source-body contact trench 110, the Schottky contact trench 116 and the gate contact trench 117. Besides, the gate electrodes 104, 104' and 104" are connected to the gate metal 118 and the shielded electrodes 105, 105' and 105" are connected to the source/anode metal 119. The barrier metal layer 113 can be implemented by Ti/TiN or Co/TiN, the Schottky barrier layer can be implemented by $TiSi_2$ (Ti Silicide) or $CoSi_2$ (Co Silicide), and the front metal can be implemented by Ti/Aluminum.

Figure 2:
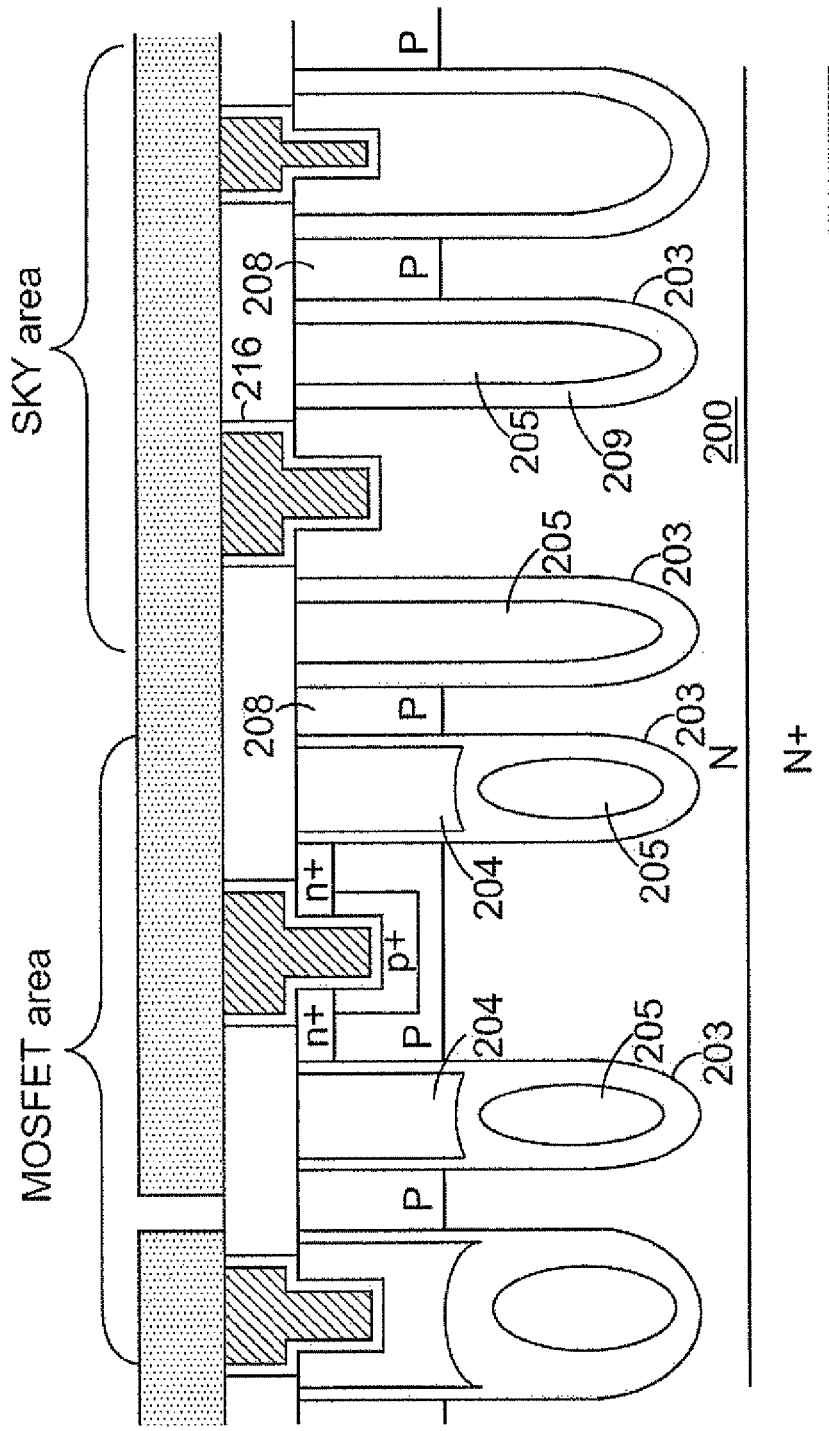
FIG. 2 is a cross-sectional view of another preferred embodiment according to the present invention.

Please refer to FIG. 2 for another preferred N-channel integrated circuit comprising a trench MOSFET and a trench Schottky rectifier (SKY, as illustrated in FIG. 2) on a single chip. The integrated circuit in FIG. 2 has similar configuration to FIG. 1 except that, the Schottky contact trench 216 is formed between two adjacent gate trenches 203 only filled with the shielded electrode 205 in the trench Schottky rectifier which is different from other gate trenches 203 in the trench MOSFET filled with the gate electrode 204 over the shielded electrode 205, wherein the shielded electrode 205 in the gate trenches 203 in the trench Schottky rectifier is insulate from the adjacent N epitaxial layer 200 and the P body region 208 by a second gate insulation layer 209.

Figure 3:
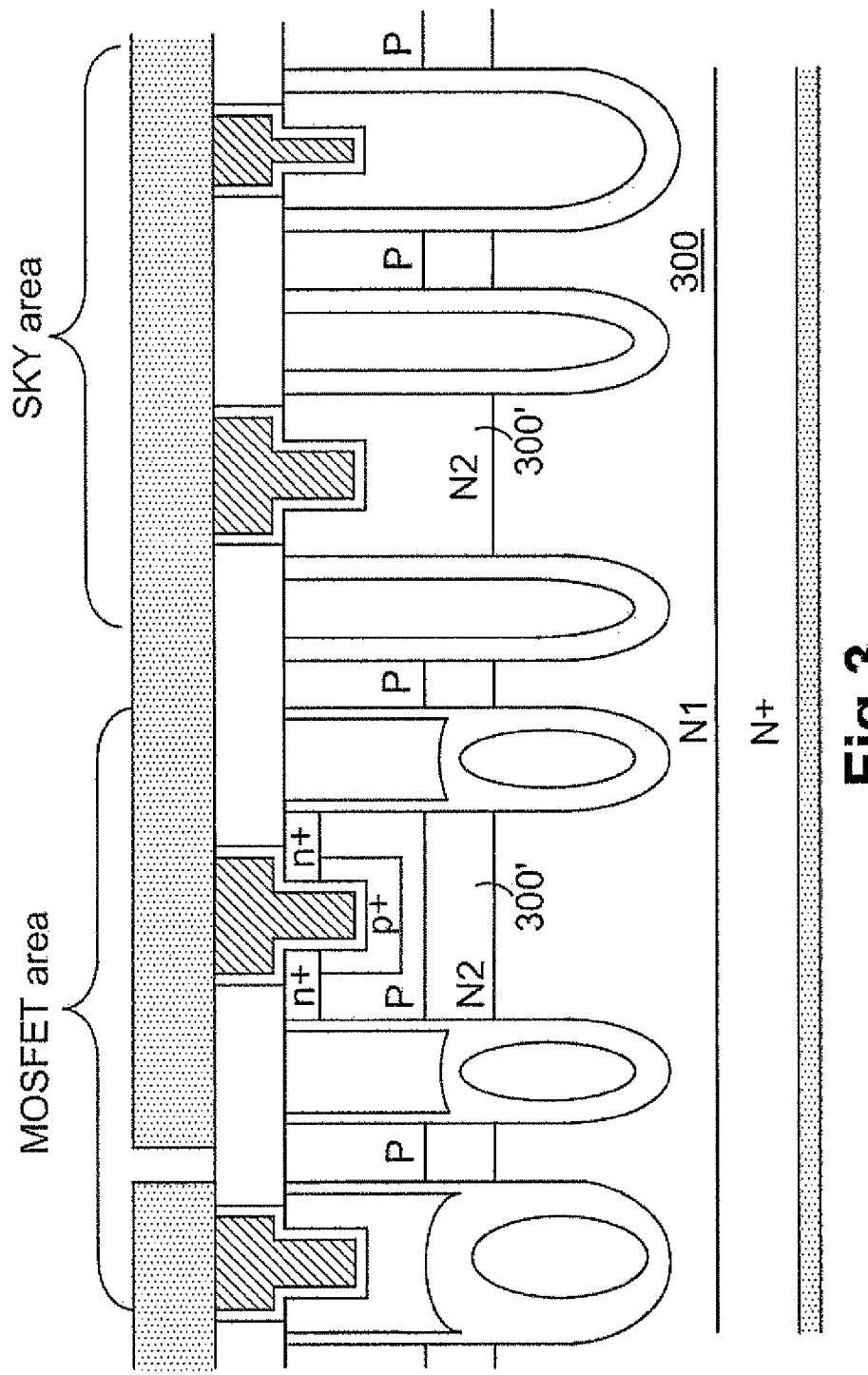
FIG. 3 is a cross-sectional view of another preferred embodiment according to the present invention.

Please refer to FIG. 3 for another preferred N-channel integrated circuit comprising a trench MOSFET and a trench Schottky rectifier (SKY, as illustrated in FIG. 3) on a single chip which has similar configuration to FIG. 2 except that, the integrated circuit in FIG. 3 has double N epitaxial layers comprising a bottom N1 epitaxial layer 300 and a top N2 epitaxial layer 300', wherein the bottom N1 epitaxial layer 300 has a higher doping concentration than the top N2 epitaxial layer 300' to further reduce a forward voltage drop and a reverse leakage current for the trench Schottky rectifier.

Figure 4:
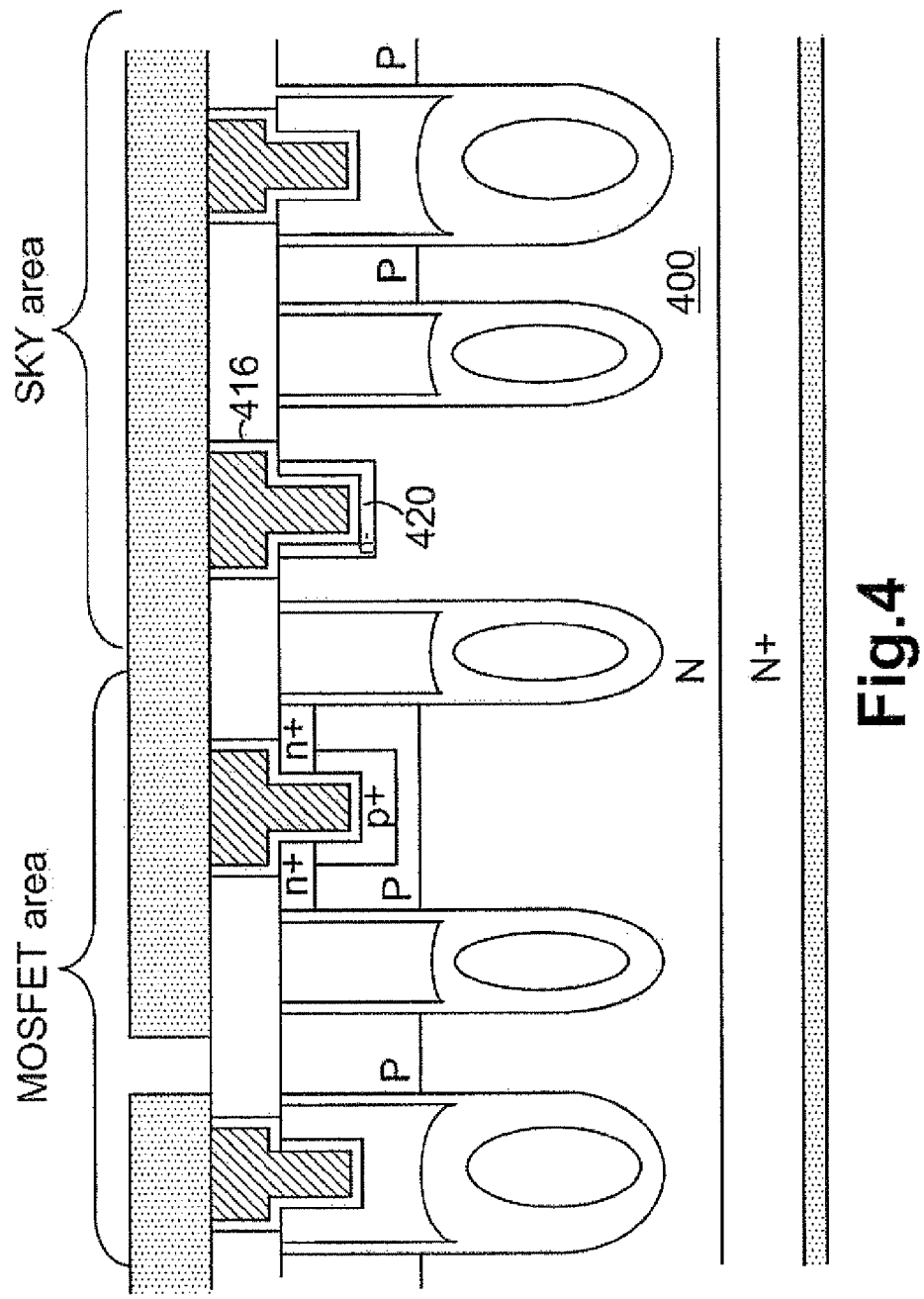
FIG. 4 is a cross-sectional view of another preferred embodiment according to the present invention.

Please refer to FIG. 4 for another preferred N-channel integrated circuit comprising a trench MOSFET and a trench Schottky rectifier (SKY, as illustrated in FIG. 4) on a single chip which has similar configuration to FIG. 1 except that, the integrated circuit in FIG. 4 has an n− Schottky barrier height enhancement region 420 surrounding bottom and sidewalls of the Schottky contact trench 416 within the N epitaxial layer 400 in the trench Schottky rectifier, wherein the n− Schottky barrier height enhancement region 420 has a lower doping concentration than the N epitaxial layer 400.

Figure 5:
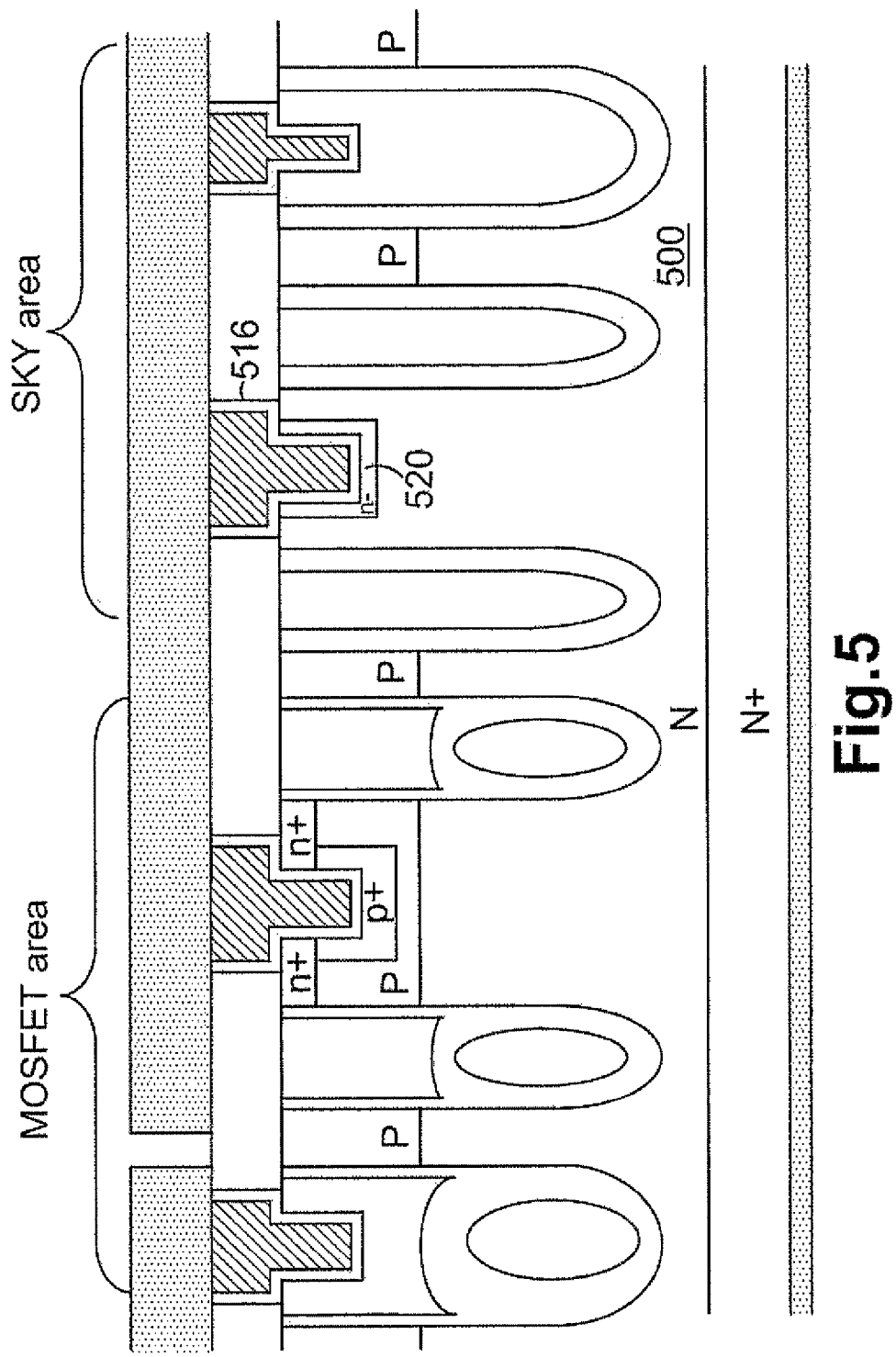
FIG. 5 is a cross-sectional view of another preferred embodiment according to the present invention.

Please, refer to FIG. 5 for another preferred N-channel integrated circuit comprising a trench MOSFET and a trench Schottky rectifier (SKY, as illustrated in FIG. 5) on a single chip which has similar configuration to FIG. 2 except that, the integrated circuit in FIG. 5 has an n− Schottky barrier height enhancement region 520 surrounding bottom and sidewalls of the Schottky contact trench 516 within the N epitaxial layer 500 in the trench Schottky rectifier, wherein the n− Schottky barrier height enhancement region 520 has a lower doping concentration than the N epitaxial layer 500.

Figure 6:
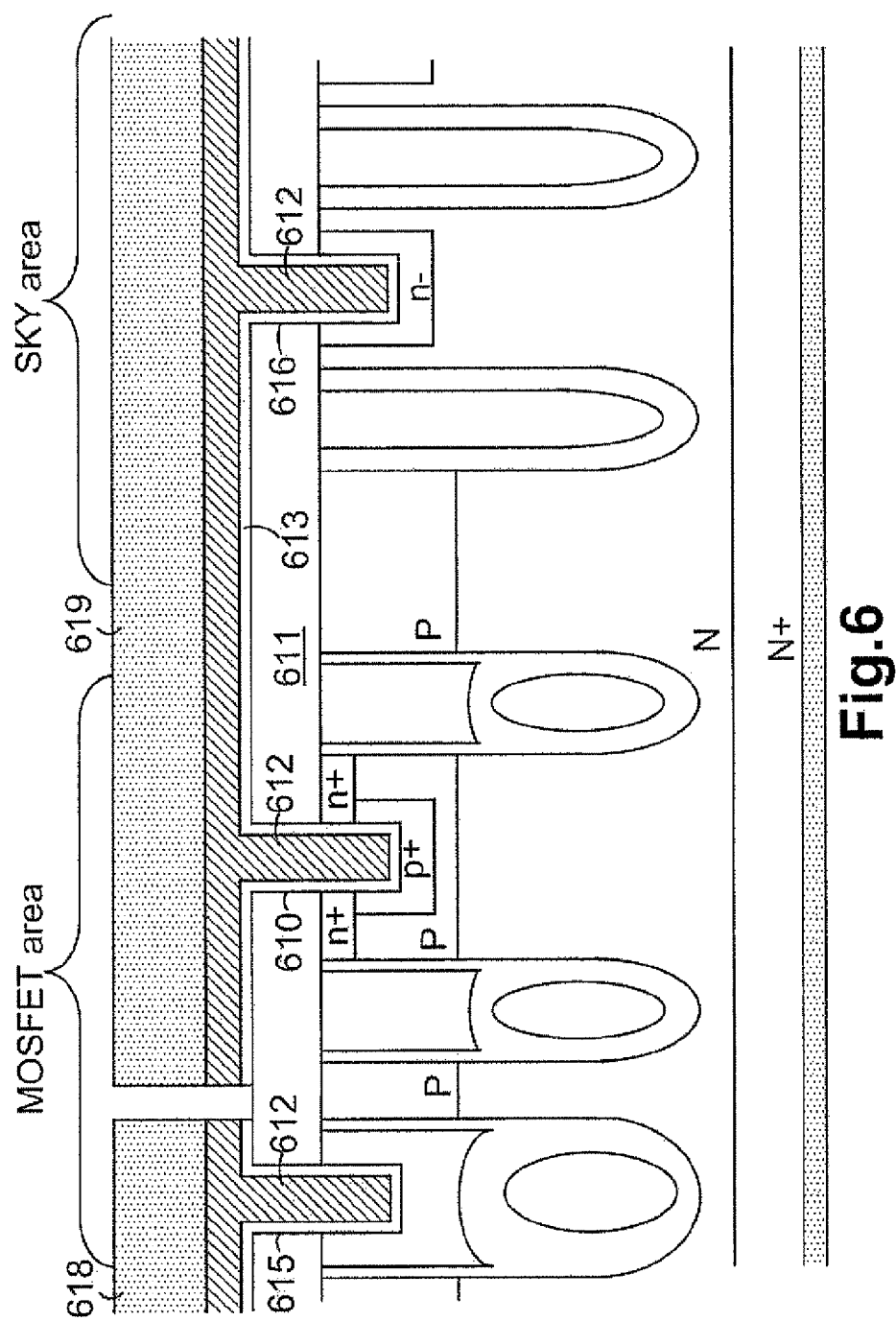
FIG. 6 is a cross-sectional view of another preferred embodiment according to the present invention.

Please refer to FIG. 6 for another preferred N-channel integrated circuit comprising a trench MOSFET and a trench Schottky rectifier (SKY, as illustrated in FIG. 6) on a single chip which has similar configuration to FIG. 5 except that in FIG. 6, the contact metal plugs 612, for example tungsten plugs padded by a barrier metal layer 613 of Ti/TiN or Co/TiN filled in the source-body contact trench 610 and the gate contact trench 615 in the trench MOSFET and in the Schottky contact trench 616 in the trench Schottky rectifier extend to cover top surface of the contact insulation layer connected to the gate metal 618 and the source/anode metal 619, respectively.

Figure 7:
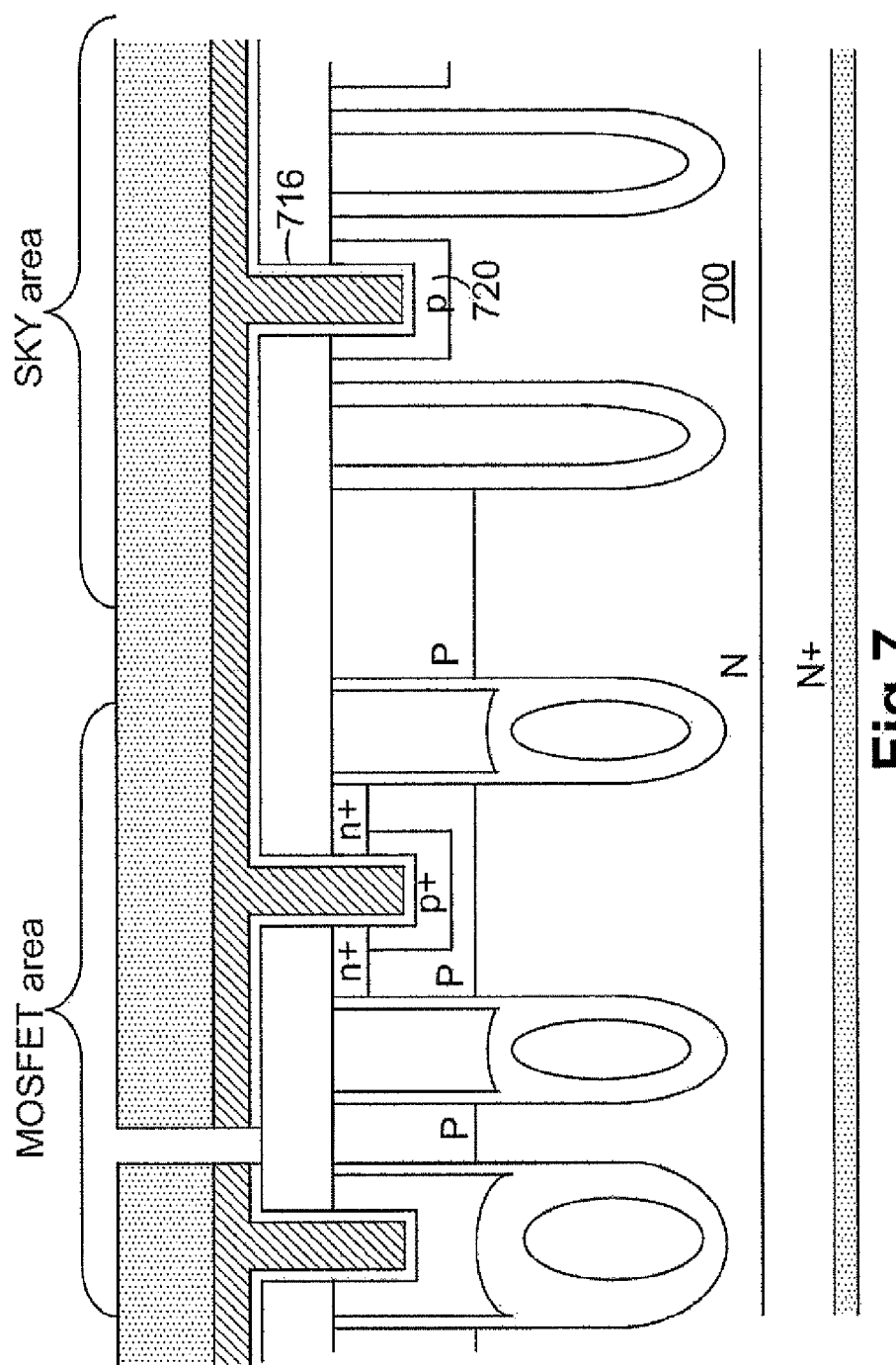
FIG. 7 is a cross-sectional view of another preferred embodiment according to the present invention.

Please refer to FIG. 7 for another preferred N-channel integrated circuit comprising a trench MOSFET and a trench Schottky rectifier (SKY, as illustrated in FIG. 7) on a single chip which has similar configuration to FIG. 6 except that, the integrated circuit in FIG. 7 has a p Schottky barrier height enhancement region 720 surrounding bottom and sidewalls of the Schottky contact trench 716 within the N epitaxial layer 700 in the trench Schottky rectifier.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An integrated circuit comprising a plurality of trench MOSFETs and a plurality of trench Schottky rectifiers horizontally disposed in to different areas further comprising:

a substrate of a first conductivity type;

an epitaxial layer of said first conductivity type over said substrate said epitaxial layer having a lower doping concentration than said substrate;

a plurality of gate trenches extending into said epitaxial layer;

a trench MOSFET comprising a gate electrode over a shielded electrode in said gate trench wherein said gate electrode and said shielded electrode insulated from each other by an inter-electrode insulation layer wherein said gate electrode insulated from a source region of said first conductivity type and body region of a second conductivity type by a first gate insulation layer and said shield electrode insulated from said epitaxial layer by a second gate insulation layer;

said gate electrode surrounded by said source region encompassed in said body region above said shielded electrode;

said gate electrode connected to a gate metal and said shielded electrode to a source metal;

a source-body contact trench opened in said trench MOSFET through said source region and extended into said body region and filled with a contact metal plug overlying a barrier metal layer therein, said contact metal plug filled in said source-body contact trench connected to said source metal;

a trench Schottky rectifier formed into said epitaxial layer in a different area from said trench MOSFET had having a Schottky barrier layer lined in a Schottky contact trench filled with said contact metal plug overlying said barrier metal layer directly contacting said Schottky contact trench bottom and sidewalls, and between a pair of adjacent gate trenches wherein said source and body regions do not exist, said contact metal plug filled in said Schottky contact trench connected with an anode metal;

said gate trenches in said trench MOSFET and trench Schottky rectifier having a greater trench depth than said Schottky contact trench into said epitaxial layer;

said Schottky rectifier formed at least along sidewalls of said Schottky contact trench in said epitaxial layer, separated from said pair of adjacent gate trenches by said epitaxial layer without having said source and body regions surrounding said Schottky contact trench sidewalls;

at least a gate contact trench in trench MOSFET area opened through a contact insulation layer and extended into said gate electrode in a wide gate trench having greater trench width than said gate trenches in said trench MOSFET area, and filled with said contact metal plug overlying said barrier metal layer therein, said contact metal plug filled in said gate contact trench connected with said gate metal; and said source metal and said anode metal connected together as a source/anode metal.

2. The integrated circuit of claim 1, wherein said gate trenches in said trench Schottky rectifier are filled with said gate electrode over said shielded electrode.

3. The integrated circuit of claim 2, wherein said gate electrode in said trench Schottky rectifier area extends to a wide gate electrode in a wide gate trench having a greater trench width than said gate trenches in said trench Schottky rectifier area, and at least a gate contact trench in said trench MOSFET area opened through a contact insulation layer and extended into said gate electrode, and filled with said contact metal plug overlying a barrier layer therein, said contact metal plug filled in said gate contact trench connected with said source/anode metal and separated from said gate electrode in said trench MOSFET area.

4. The integrated circuit of claim 1, wherein said gate trenches in said trench Schottky rectifier are filled with said shielded electrode only.

5. The integrated circuit of claim 4, wherein said shielded electrode in said trench Schottky rectifier area extends to a wide shielded electrode in a wide gate trench having a greater trench width than said gate trenches in said trench Schottky rectifier area, and at least a shielded contact trench in said trench MOSFET area opened through a contact insulation layer and extended into said shielded electrode, and filled with said contact metal plug overlying a barrier metal layer therein, said contact metal plug filled in said shielded contact trench connected with said source/anode metal.

6. The integrated circuit of claim 1, wherein said barrier metal layer lines in said source-body and Schottky contact trenches is Ti/TiN or Co/TiN.

7. The integrated circuit of claim 1, wherein said contact metal plug overlying said barrier metal layer is tungsten.

8. The integrated circuit of claim 1, wherein said Schottky barrier layer comprises TiSi2 (Ti Silicide) or CoSi2 (Co Silicide).

9. The integrated circuit of claim 1, wherein said source/anode metal and gate metal are Ti/Aluminum alloys, Ti/TiN/Aluminum alloys, or Ti/TiN/Copper disposed on top of said contact insulation layer and said contact metal plugs.

10. The integrated circuit of claim 1, wherein said Schottky barrier layer lines along sidewalls and bottom of each said Schottky contact trench.

11. The integrated circuit of claim 1, wherein said Schottky barrier layer lines along only sidewalk of each said Schottky contact trench in said epitaxial layer.

12. The integrated circuit of claim 1, wherein said epitaxial layer is a single epitaxial layer.

13. The integrated circuit of claim 1, wherein said epitaxial layer is a double epitaxial layer with a doping concentration of the top epitaxial layer less than that of the bottom epitaxial layer.

14. The integrated circuit of claim 1 further comprises a body contact region of said second conductivity type formed only within said body region wrapping sidewalls and bottom of each said source-body contact trench, but not formed within said trench Schottky rectifier, wherein said body contact region has a higher doping concentration than said body region.

15. The integrated circuit of claim 1 further comprises a Schottky barrier height enhancement region of said first conductivity having doping concentration less than said epitaxial layer, formed within said epitaxial layer in said trench Schottky rectifier and wrapping sidewalls and the bottom of each said Schottky contact trench in said trench Schottky rectifier.

16. The integrated circuit of claim 1 further comprises a Schottky barrier height enhancement region of said second conductivity formed within said epitaxial layer in said trench Schottky rectifier and wrapping sidewalls and bottom of each said Schottky contact trench in said trench Schottky rectifier.

17. The integrated circuit of claim 1, wherein said contact metal plugs filled in said source-body contact trench and said gate contact trench in said trench MOSFET, and said Schottky contact trench in said trench Schottky rectifier extend to cover top surface of said contact insulation layer connected with gate metal and said source/anode metal, respectively.

18. The integrated circuit of claim 17, wherein said metal contact metal plug is Tungsten (W) layer deposited over a Ti/TiN or Co/TiN barrier metal layer, covering said contact insulation layer.

19. The integrated circuit of claim 17, wherein said source/anode metal and said gate metal are Ti/Aluminum alloys, Ti/TiN/Aluminum alloys, or Ti/TiN/Copper disposed on top of said contact metal plugs.

20. The integrated circuit of claim 1, wherein said first gate insulation layer has a thickness along said gate trenches less than that of said second gate insulation layer.

* * * * *